United States Patent
Ashdown

(10) Patent No.: US 12,099,784 B2
(45) Date of Patent: Sep. 24, 2024

(54) SYSTEM AND METHOD FOR REAL-TIME SOUND SIMULATION

(71) Applicant: SUNTRACKER TECHNOLOGIES LTD., Victoria (CA)

(72) Inventor: Ian Edward Ashdown, West Vancouver (CA)

( * ) Notice: Subject to any disclaimer, the term of this patent is extended or adjusted under 35 U.S.C. 154(b) by 0 days.

(21) Appl. No.: 18/256,030

(22) PCT Filed: Mar. 8, 2023

(86) PCT No.: PCT/CA2023/050301
§ 371 (c)(1),
(2) Date: Jun. 5, 2023

(87) PCT Pub. No.: WO2023/184015
PCT Pub. Date: Oct. 5, 2023

(65) Prior Publication Data
US 2023/0342518 A1    Oct. 26, 2023

Related U.S. Application Data

(60) Provisional application No. 63/325,506, filed on Mar. 30, 2022.

(51) Int. Cl.
G06F 30/20   (2020.01)
G06F 30/13   (2020.01)

(52) U.S. Cl.
CPC .............. *G06F 30/20* (2020.01); *G06F 30/13* (2020.01)

(58) Field of Classification Search
None
See application file for complete search history.

(56) References Cited

U.S. PATENT DOCUMENTS

| | | | |
|---|---|---|---|
| 8,995,675 B2 | 3/2015 | Chandak et al. | |
| 10,679,407 B2 | 6/2020 | Schissler et al. | |
| 10,952,302 B2 | 3/2021 | Ashdown et al. | |
| 2012/0269355 A1 | 10/2012 | Chandak et al. | |
| 2015/0378019 A1 | 12/2015 | Schissler et al. | |
| 2019/0215932 A1* | 7/2019 | Ashdown | H05B 45/20 |

OTHER PUBLICATIONS

Tsingos et al., Acoustic simulation using hierarchical time-varying radiant exchanges, 1997, Sop.inria.fr, pp. 1-9 (Year: 1997).*

(Continued)

*Primary Examiner* — Boris Gorney
*Assistant Examiner* — Bernard E Cothran
(74) *Attorney, Agent, or Firm* — Damien G Loveland; Valuetech Patent Agency Inc.

(57) ABSTRACT

The present invention relates to the real-time simulation of sound in three-dimensional virtual environments. In particular, a geometric method based on the principles of acoustic radiosity determines the room impulse responses of a virtual environment with arbitrary polygonal surfaces. The complexity of the method is of the order of the square of the number of patches that define the virtual environment. The room impulse responses are convolved with an audio signal and output through a speaker to simulate reverberation within the virtual environment, which corresponds to a physical environment.

15 Claims, 11 Drawing Sheets

(56) References Cited

OTHER PUBLICATIONS

Various methods for calculating form factors are described in Chapter 5 of Ashdown, I. 1994. Radiosity: A Programmer's Perspective. New York, NY: John Wiley & Sons.
Nosal, E.M., M. Hodgson, and I. Ashdown. 2004. "Improved Algorithms and Method for Room Sound-Field Prediction by Acoustical Radiosity in Arbitrary Polygonal Rooms," J. Acoustical Society of America 116(2):970-980.

* cited by examiner

SYSTEM AND METHOD FOR REAL-TIME SOUND SIMULATION

TECHNICAL FIELD

The present invention relates to the real-time simulation of sound in three-dimensional virtual environments, in which acoustic impulse responses are generated for virtual environments with arbitrary polygonal surfaces. These impulse responses are convolved with an audio signal to simulate reverberation within the environment.

BACKGROUND

Impulse response functions are often used in the design and analysis of lecture rooms, concert halls, and other large enclosed architectural spaces to determine their acoustic reverberation characteristics. Given an impulse response for one or more source positions and a receiver position within the space, each impulse response can be convolved with an audio signal to simulate reverberation of the signal within the space. Three classes of geometric methods exist to determine the impulse responses of virtual architectural spaces: 1) image sources; 2) ray tracing; and 3) acoustic radiosity.

Image Sources

Image sources enumerate specular reflection paths within the virtual environment. As shown in FIG. 1, isotropically emitting source 100 is positioned distance 'd' above plane 105, and emits a series of impulses 110. Each impulse is specularly reflected from plane 105. These reflections can be represented by an image source 115 that is positioned distance 'd.' below plane 105, and which emit a series of reflected impulses 120.

In a complex environment with arbitrary polygonal surfaces, the reflection of an impulse from each surface can be represented by an image source. The impulse response for a receiver is then given by the sum of the contributions of the emitting sources and their image sources.

A disadvantage of the image source method is that the number of images sources grows geometrically with the number of reflections. For n surfaces and k reflections, the number of required image sources is $\Sigma_{i=1}^{i=k} n(n-1)^{i-1}$. Thus, the image source method is typically limited to the first few reflections, and subsequent reflections (the reverberant "tail") are approximated by other means.

Another disadvantage of the image source method is that it can only model specular reflections. This assumption is usually valid for smooth surfaces such as drywall and paneling, but not for rough surfaces where the roughness is greater than approximately 1/10 of the audio signal wavelength. For a frequency of 1 kilohertz, for example, roughness on the order of one inch or greater will tend to diffuse the reflected sound.

Ray Tracing

In FIG. 2, a source 205 and a receiver 210 are positioned within an empty rectangular room 200 with floor 215, walls 220, and ceiling 225. A geometric ray 230 with a specified amount of acoustic energy E is emitted in a random direction by source 205 and specularly reflected as ray 235 from ceiling 225. The ceiling material has a frequency-dependent absorption parameter, and so some of the ray energy is absorbed upon reflection.

Geometric ray 235 is subsequently reflected as ray 240 from floor 215. The floor material is not ideally specular, and so diffuse rays 245 are also reflected. The floor material also has a frequency-dependent absorption parameter, and so some of the energy of 235 is absorbed upon reflection. Geometric ray 240 is incident upon wall 220, which further absorbs a portion of its energy. The remaining energy of the specific geometric ray 240 is below a preset threshold, and so the ray is terminated. Acoustic energy is also absorbed by traversal of the rays through air, and so diffusely-scattered rays 245 are terminated before they intersect a room surface.

The likelihood of a geometric ray emitted in a random direction by source 205 being intercepted by receiver 210 before being terminated after multiple reflections is exceedingly low, and so the receiver is typically represented by a finite volume sphere. Even so, hundreds of thousands to millions of rays must be emitted for the receiver to intercept a sufficient number of rays that accurately represents the reflected acoustic energy incident upon the receiver position. (The direct acoustic energy is trivially determined by tracing a ray from the source to the receiver.)

The advantages of ray tracing are that it can represent: 1) non-isotropic sources, such as loudspeakers; 2) materials with semi-specular and diffuse reflection characteristics; and 3) non-omnidirectional receivers, such as human ears.

FIG. 3 shows an example of beam tracing, wherein a source 305 and a receiver 310 are positioned within an empty rectangular room 300 with floor 315, walls 320, and ceiling 325. A pyramidal beam 330 is emitted in a random direction by source 305 and specularly reflected as beam 335 from ceiling 325. Geometric beam 335 is subsequently reflected as beam 340 from floor 315.

FIG. 4 shows an example of beam tracing with beam splitting, wherein a source 405 and a receiver 410 are positioned within an empty rectangular room 400 with floor 415, walls 420, and ceiling 425. A pyramidal beam 435 is emitted in a random direction by source 405 and specularly reflected as beam 440 from ceiling 425. Geometric beam 440 is subsequently reflected as beam 445 from floor 415.

An advantage of beam tracing is that unlike rays, the beams have volume, and hence are more likely to intercept the receiver. (In FIG. 3, beam 340 intercepts receiver 310.) A disadvantage, however, is that a beam must be split into two or more separate beams if it partially intercepts a polygonal surface. The cross-sections of the beams become increasingly complex with subsequent reflections, possibly including cross-sections with holes. Calculating the intersection of such beams with arbitrary polygonal surfaces becomes correspondingly more complex and time-consuming. FIG. 4 shows that beam 445 is partially intercepted by offset 430 and so must be split to form separate beam 450.

Yet another disadvantage of beam tracing is that, unlike ray tracing, it cannot easily model semi-specular and diffuse reflections from surfaces. It must further be assumed that the acoustic energy within a beam is constant, thereby requiring very narrow beam spreads if non-isotropic sources are to be accurately modeled.

A further disadvantage of both the ray tracing and beam tracing methods is that the receiver position must be predetermined in order to calculate the impulse response. If another impulse response for another position is required, the ray tracing or beam tracing calculations must be repeated.

Acoustic Radiosity

Referring to FIG. 5, wall 505 of empty rectangular room 500 is subdivided in an array of "patches" 510. Similarly, all room surfaces are subdivided into an array of one or more patches. The room has a source 515 and a receiver 520. Each patch is assigned a time buffer (an "echogram") 525 (FIG. 5A) that records the acoustic power (measured in watts per square meter) that is emitted as an impulse by source 515 and received by the patch over a period of time, including reflected acoustic power from other patches. Each patch has a reflectance p that is less than unity, and so the reflected impulses exponentially decay over time.

The acoustic radiosity method begins by first calculating the form factor between each pair of patches, where a "form factor" is the geometric visibility of one patch from another, and is used to determine the portion of radiation diffusely emitted by one patch that is received by the other patch. If there are for example n patches in the environment, there are $n^2$ form factors F(S→R) between sender patch S and receiver patch R. (Various methods for calculating form factors are described in Chapter 5 of Ashdown, I. 1994. Radiosity: A Programmer's Perspective. New York, NY: John Wiley & Sons.) These form factors are calculated independently of the source and receiver positions. With a means of calculating form factors, the acoustic radiosity model proceeds as shown in the flowchart shown in FIG. 6, following, for example, Nosal, E.-M., M. Hodgson, and I. Ashdown. 2004. "Improved Algorithms and Method for Room Sound-Field Prediction by Acoustical Radiosity in Arbitrary Polygonal Rooms," J. Acoustical Society of America 116(2):970-980.

In Step 600, the time interval t is set to zero, representing the time that source 515, labelled E, emits an impulse.

In Step 605, the first of n patches 510, labelled R, that will receive the impulse is selected.

In Step 610, the time delay t'=Δt(E→R) between the impulse being emitted by the source E and the impulse being received by the receiver patch R, as determined by the velocity of sound (approximately 340 meters per second in air), is calculated. The value of t' is discretized to be a multiple of the time buffer resolution.

In Step 615, the acoustic power B received by receiver patch R at time t' from source E is inserted into the patch time buffer. This represents the direct contribution of acoustic power from source E to patch R.

In Step 620, if more receiver patches are to be processed, control returns to Step 605; otherwise, control continues to Step 625.

In Step 625, the first of n patches 510, labelled S, that will act as a sender to reflect acoustic power, is selected.

In Step 630, the first of n patches 510, excluding patch S, labelled R, that will act as a receiver of acoustic power reflected by sender patch S, is selected.

In Step 635, the time delay t'=Δt(S→R) between the impulse being emitted by the sender patch S and the impulse being received by the receiver patch R, is calculated. The value of t' is discretized to be a multiple of the time buffer resolution.

In Step 640, the acoustic power B received by receiver patch R at time t' from sender patch S and calculated as B(R, t')=B(S, t)*ρ(S)F(S→R)+B(R, t'), where ρ(S) is the (possibly frequency-dependent) acoustic reflectance of patch S, is inserted into the patch time buffer. This represents the indirect (i.e., reflected) contribution of acoustic power from patch S to patch R.

In Step 645, if more receiver patches are to be processed, control returns to Step 630; otherwise, control continues to Step 650.

In Step 650, if more sender patches are to be processed, control returns to Step 625; otherwise, control continues to Step 655.

In Step 655, the time interval t is incremented by the time resolution of the time buffers.

In Step 660, the time interval t is compared with the length of the time buffers. If it does not exceed the time buffer length, control returns to Step 625; otherwise, control continues to Step 665.

In Step 665, the calculation of the echogram for each of the n patches terminates.

Expressed in pseudocode, the prior art acoustic radiosity algorithm is:

```
t = 0
FOR each time interval t
    // Add direct contribution
    FOR each receiver patch R
        t' = t + Δt(E→R)
        B(R,t') = B(R,E,t')
    ENDFOR
    // Add indirect contribution
    FOR each sender patch S
        // Propagate energy from sender S to receivers
        FOR each receiver R
            t' = t + Δt(S→R)
            B(R,t') = B(S,t) * ρ(R)F(S→R) + B(R,t')
        ENDFOR
    ENDFOR
ENDFOR
```

As is well-known to those skilled in the art, the acoustic radiosity algorithm has several disadvantages. First, it has $O(n^2 t)$ time complexity, where n is the number of patches and t is the number of time steps for the patch time buffers. Second, it requires all form factors F(S→R) to be precomputed. Third, it can only model surfaces with ideal diffuse reflection characteristics. This is not a particular concern for "toy" environments comprised of an empty rectangular room with a small number of patches, such as is shown in FIG. 5. However, an architectural model of, for example, a concert hall, may be comprised of tens to hundreds of thousands of patches. Even with geometric simplification of the model, there might be ten thousand patches, each with a time buffer of 10,000 steps. It is also likely that the calculations would have to repeated two to three times to take into account the frequency-dependent reflectance characteristics of the patch materials. The time complexity means that the concert hall model would take thirty to forty thousand times longer than the empty room model to calculate.

It is also well-known to those skilled in computer graphics that computing form factors in complex geometric environments typically consumes 90 percent of the CPU (central processing unit) time needed to perform calculations for visual radiosity applications. (See, for example, Ashdown 1994.) In addition, the memory requirements for storing the form factors of ten thousand patches would be two hundred megabytes.

This background is not intended, nor should be construed, to constitute prior art against the present invention.

SUMMARY OF THE INVENTION

The present invention relates to the real-time simulation of sound in three-dimensional virtual environments. In particular, a geometric method based on the principles of acoustic radiosity determines the acoustic impulse responses of a virtual environment with arbitrary polygonal surfaces.

These impulse responses are then convolved with an audio signal to simulate reverberation within the environment. The pre-calculated impulse responses can be convolved with an audio signal in real-time and output through a speaker, for example, so that the expected reverberation of a real or physical environment that corresponds to the virtual environment can be heard.

The system and method generate a "room impulse response" (RIR) for a given spatial position in the room, using a model of the room. An RIR may also be referred to as an echogram. The physical equivalent of creating an RIR is broadcasting a loud click with an omnidirectional loudspeaker (equivalent to setting off a firecracker) located at a "source" position in the room, and then at the given spatial position recording the decaying echoes over time from the direct and reflected sound waves. The RIR that is generated is then convolved in real-time with an audio source that would be at the source position in the room to simulate acoustic properties of the room at the given spatial position.

To achieve this, the inventor has recognized a need for an acoustic radiosity algorithm that has a time complexity of $O(n^2)$, that does not need to precompute form factors, and which can represent reflections from diffuse and semi-specular surfaces.

Disclosed is a method for simulating acoustics of a physical environment within a building comprising the steps of: (a) dividing surfaces of a virtual environment that corresponds to the physical environment into patches, each patch having an echogram; (b) distributing total acoustic power of an audio impulse generated by an acoustic source directly to those of the patches that are visible to the acoustic source; (c) storing, in the echogram for each patch that receives a portion of the total acoustic power, a value and a time corresponding to said portion of the total acoustic power; (d) selecting the patch that has the most acoustic power to reflect; (e) determining acoustic power that is absorbed by the selected patch; (f) distributing reflected acoustic power from the selected patch to those of the patches that are visible to the selected patch; (g) storing, in the echogram for each patch that receives a portion of the reflected acoustic power, a value and a time corresponding to said portion of the reflected acoustic power; (h) repeating steps (d) to (g) until a difference between the total acoustic power and a total of the acoustic power absorbed by all selected patches has reached a threshold; and (i) playing, via an audio output device, an audio signal that has been convolved with one of the echograms.

Further disclosed is a system for simulating acoustics of a physical environment within a building comprising: an audio output device; a processor; and computer readable memory storing computer-readable instructions, which, when executed by the processor cause the system to: (a) divide surfaces of a virtual environment that corresponds to the physical environment into patches, each patch having an echogram; (b) distribute total acoustic power of an audio impulse generated by an acoustic source directly to those of the patches that are visible to the acoustic source; (c) store, in the echogram for each patch that receives a portion of the total acoustic power, a value and a time corresponding to said portion of the total acoustic power; (d) select the patch that has the most acoustic power to reflect; (e) determine acoustic power that is absorbed by the selected patch; (f) distribute reflected acoustic power from the selected patch to those of the patches that are visible to the selected patch; (g) store, in the echogram for each patch that receives a portion of the reflected acoustic power, a value and a time corresponding to said portion of the reflected acoustic power; (h) repeat steps (d) to (g) until a difference between the total acoustic power and a total of the acoustic power absorbed by all selected patches has reached a threshold; and (i) play, via an audio output device, an audio signal that has been convolved with one of the echograms.

Also disclosed is computer readable memory storing computer-readable instructions, which, when executed by a processor cause the processor to: (a) divide surfaces of a virtual environment that corresponds to the physical environment into patches, each patch having an echogram; (b) distribute total acoustic power of an audio impulse generated by an acoustic source directly to those of the patches that are visible to the acoustic source; (c) store, in the echogram for each patch that receives a portion of the total acoustic power, a value and a time corresponding to said portion of the total acoustic power; (d) select the patch that has the most acoustic power to reflect; (e) determine acoustic power that is absorbed by the selected patch; (f) distribute reflected acoustic power from the selected patch to those of the patches that are visible to the selected patch; (g) store, in the echogram for each patch that receives a portion of the reflected acoustic power, a value and a time corresponding to said portion of the reflected acoustic power; (h) repeat steps (d) to (g) until a difference between the total acoustic power and a total of the acoustic power absorbed by all selected patches has reached a threshold; and (i) play, via an audio output device, an audio signal that has been convolved with one of the echograms.

This summary provides a simplified, non-exhaustive introduction to some aspects of the invention, without delineating the scope of the invention.

DETAILED DESCRIPTION

The present invention, while addressing acoustic radiosity, is derived from the principles of the visual radiosity method as disclosed in, for example, Ashdown 1994. This method is based on the concept of transferring luminous or radiant flux (i.e., light) between finite area surfaces (called "patches") rather than by randomly tracing light rays. For the purposes of acoustic radiosity, it is sufficient to consider the equivalence between: a) geometric rays of light and sound; and b) radiant flux (power) and acoustic power, which are both measured in watts.

Within this disclosure, reference to a computer includes a programmable electronic device designed to accept data, perform prescribed mathematical and logical operations at high speed, and display the results of these operations, and may include for example mainframes, desktop and laptop computers, tablets, and smartphones. Software refers to any programs and other operating information used by a computer. An algorithm, as described herein, is a process or set of rules to be followed by software and used by a computer.

The term "real-time" means that as one action is occurring, another action is occurring in response to it and at the same time, subject to inherent time lags due to electronic and mechanical limitations. The actions may appear to a human to be simultaneous, or to be close enough together that their occurrences are, for substantially all intents and purposes, as good as simultaneous.

The term "processor" is used to refer to any electronic circuit or group of circuits that perform calculations, and may include, for example, single or multicore processors, multiple processors, an ASIC (Application Specific Integrated Circuit), and dedicated circuits implemented, for example, on a reconfigurable device such as an FPGA (Field Programmable Gate Array). The processor performs the steps in the flowcharts, whether they are explicitly described as being executed by the processor or whether the execution thereby is implicit due to the steps being described as performed by code or a module. The processor, if comprised of multiple processors, may be located together or geographically separate from each other. The term includes virtual processors and machine instances as in cloud computing or local virtualization, which are ultimately grounded in physical processors.

As used in the present disclosure, the term "environment" may refer to a virtual environment comprised of a finite element model or similar computer representation with virtual sensors and control devices, or a physical environment with physical sensors and control devices.

Figure 7:
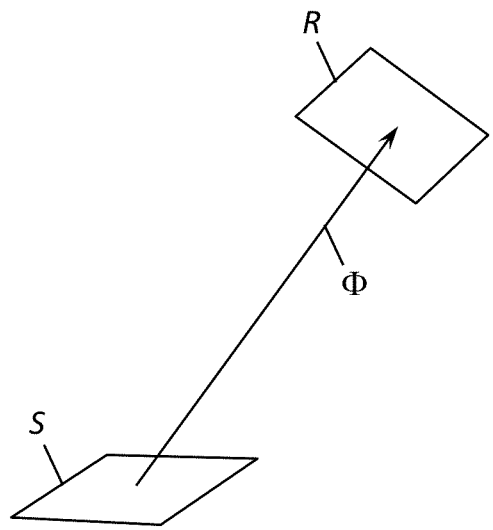
FIG. 7 show the transfer of flux $\Phi$ from sender patch S to receiver patch R.

The following discussion is adapted from U.S. Pat. No. 10,952,302. Referring to FIG. 7, at each step of the calculation process, flux Φ is diffusely emitted or reflected from a source patch S and received by a receiver patch R that is visible to the source patch. (In practice, there are typically many receiver patches, some of which may partially or fully obscure the visibility of other receiver patches as seen from the source patch.)

Form Factors

The portion of the flux that is diffusely emitted by or reflected from source patch S and which is received by receiver patch R is determined by the "form factor" F between the source and receiver patches. It is an extremely difficult and arduous mathematical problem to calculate the form factor between two patches of arbitrary shape and dimension, but a geometric approach known as Nusselt's analogy (FIG. 8) can be used to determine the form factor F between an infinitesimally small source patch dS and a finite area receiver patch R.

The outline of the receiver patch as seen from the source patch is projected onto the surface of an imaginary unit radius hemisphere H centered on the source patch. This projection P is then projected downwards onto the base B of the hemisphere; the area A of the downwards projection divided by the area of the base (i.e., π) is the form factor F. That is:

$$F = A/\pi \tag{1}$$

Figure 9:
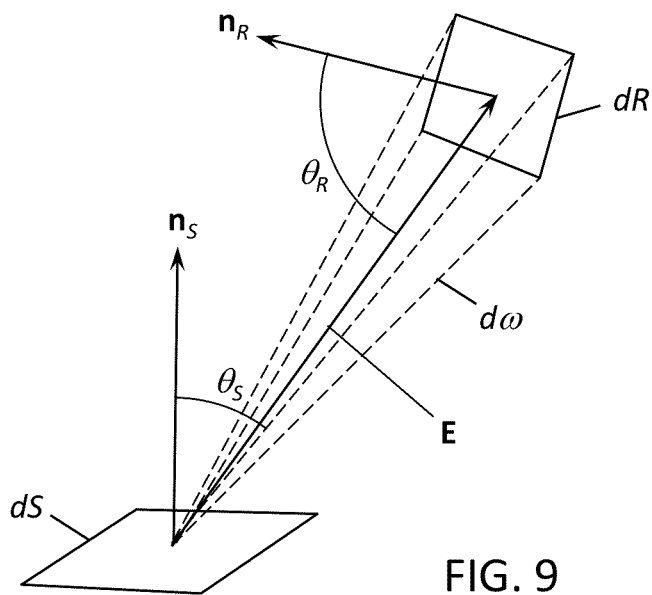
FIG. 9 shows the differential form factor dF between infinitesimal patches dS and dR.

Unfortunately, solving for the form factor F of a receiver patch of arbitrary shape and dimension using Nusselt's analogy is equally difficult, as it involves projective spherical geometry. However, given two infinitesimally small patches dS and dR separated by ray E with length r as shown in FIG. 9, the differential solid angle dω subtended by dR as seen from dS is:

$$d\omega = \cos\theta_R dA_R / r^2 \tag{2}$$

where $dA_R$ is the differential area of dR and $\theta_R$ is the angle between the ray E and the surface normal $n_R$ of receiver element dR. If we project the intersection of this solid angle with the unit hemisphere onto the hemisphere base, the area of the projection is:

$$dA = \cos\theta_S dw = \cos\theta_S \cos\theta_R dA_R / r^2 \tag{3}$$

where $\theta_S$ is the angle between the ray and the surface normal $n_S$ of the source patch.

Substituting Equation 3 into Equation 1 then gives:

$$dF = \frac{\cos\theta_S \cos\theta_R dA_R}{\pi r^2} \tag{4}$$

for the differential form factor dF from dS to dR.

Hemicubes

Figure 8:
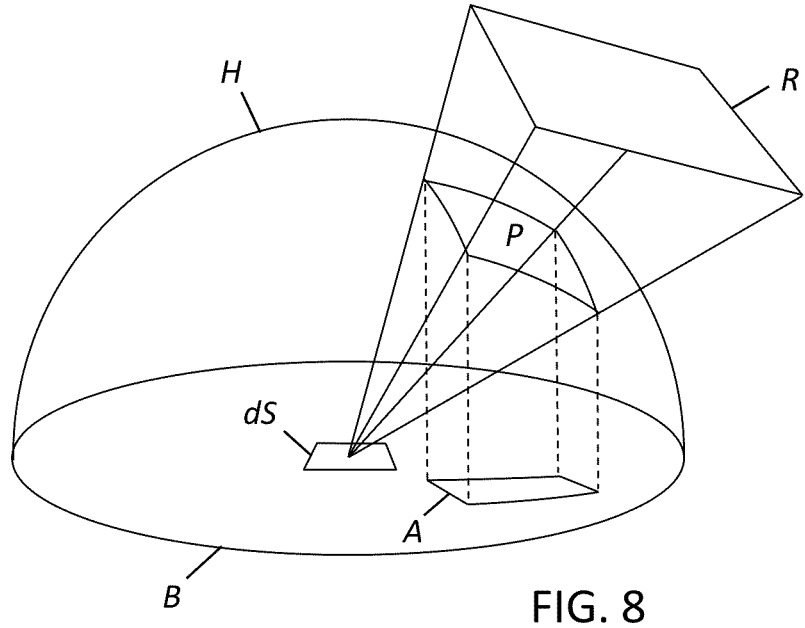
FIG. 8 show the process of form factor determination using Nusselt's analogy.
Figure 10:
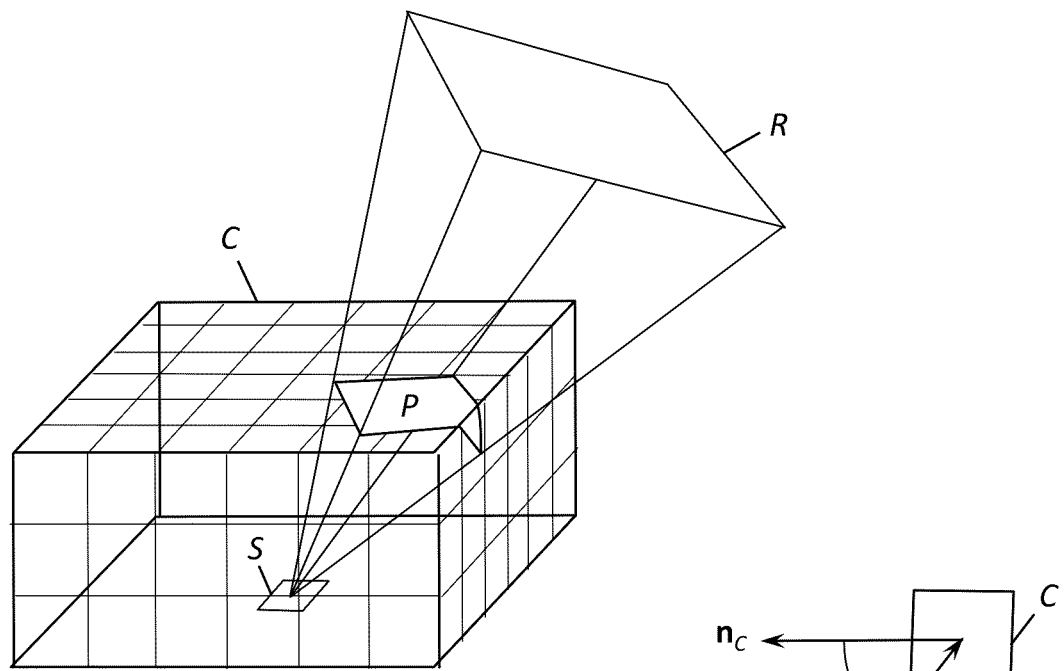
FIG. 10 shows a projection of a planar surface onto the faces of a hemicube.

If the hemisphere H of FIG. 8 is replaced with a hemicube (i.e., half of a cube) with face cells C as shown in FIG. 10, the projection P of a receiver patch R onto the hemicube involves planar rather than spherical surfaces, and so the determination of the form factor F becomes tractable. If, for example, each face of the hemicube is subdivided into a grid of square cells, the form factor F becomes:

$$F \approx \Sigma \Delta F_{covered} \tag{5}$$

where $\Delta F_{covered}$ represents the delta form factor of each hemicube face cell that the receiver patch R projects onto. As the size of the cells decreases, the delta form factor converges to dF, and so the approximation converges to the form factor F.

Figure 11:
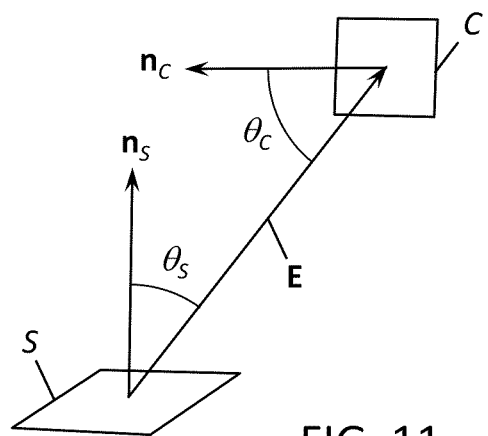
FIG. 11 shows the hemicube face cell geometry.

Referring to FIG. 11, a hemicube face cell C is oriented such that its normal $n_C$ is at an angle $\theta_C$ to the ray E with length r between the hemicube center S and the center of the face cell. From Equation 3, the delta form factor $\Delta F_C$ is therefore:

$$\Delta F_C = \frac{\cos\theta_S \cos\theta_C}{\pi r^2} \Delta A_C \tag{6}$$

where $\Delta A_C$ is the area of the face cell (as a fraction of the full face area), and the angle $\theta_S$ is determined by:

$$\cos \theta_S = E \cdot n_s / r \tag{7}$$

where $n_s$ is the hemicube plane's normal.

Cubic Tetrahedrons

Figure 12:
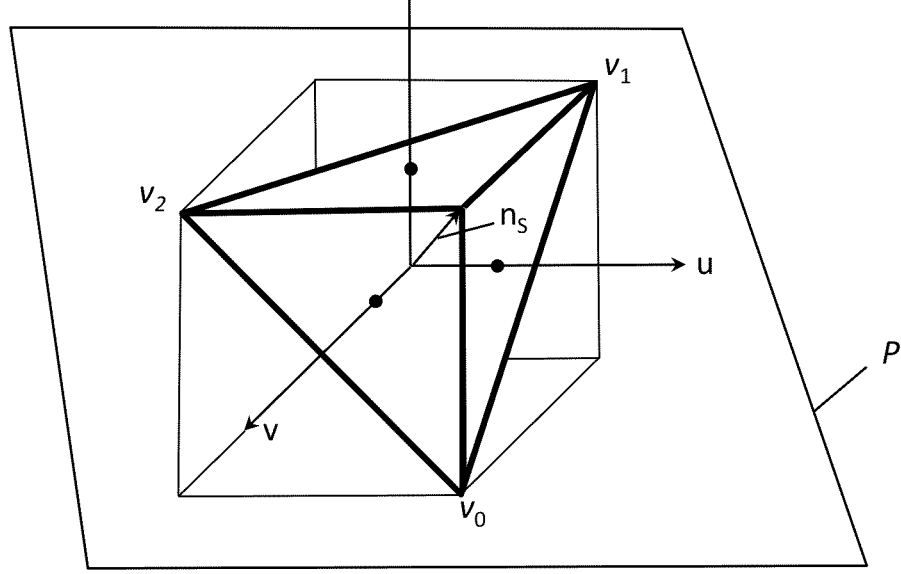
FIG. 12 shows the cubic tetrahedron geometry.

A cubic tetrahedron (a three-sided pyramid with an apex angle of 90 degrees for each side) is more computationally efficient for the purpose of calculating form factors. As shown in FIG. 12, the cubic tetrahedron is oriented in three-dimensional Cartesian coordinates (with axes u, v, and n) such that the vertices of its triangular base are positioned at $v_0=\{1, 1, -2\}$, $v_1=\{1, -2, 1\}$, and $v_2=\{-2, 1, 1\}$ and lie on the plane P. With this, the cubic tetrahedron base normal $n_S$ is described by the vector $$\left\{\frac{1}{\sqrt{3}}, \frac{1}{\sqrt{3}}, \frac{1}{\sqrt{3}}\right\}.$$

Thus, referring to FIG. 11:

$$\cos \theta_S = (E_u + E_v + E_n)/\sqrt{3}r \tag{8}$$

For cells on the cubic tetrahedron face perpendicular to the v-axis, the angle $\theta_C$ is determined by:

$$\cos\theta_C = -E \cdot n_c / r \tag{9}$$

where the face cell normal $n_C$ is described by the vector $\{0, -1, 0\}$. Also, the face lies on the plane v=1. Therefore:

$$\cos \theta_C = E_v/r = 1/r \tag{10}$$

The same result can be derived for the other two faces. Thus, for any cubic tetrahedron cell:

$$\Delta F_C = \frac{E_u + E_v + E_n}{\pi r^4 \sqrt{3}} \Delta A_C \tag{11}$$

However:

$$r^2 = E_u^2 + E_v^2 + E_n^2 \tag{12}$$

and for each face, one of $E_u$, $E_v$, or $E_n$ will always be one. Therefore:

$$\Delta F_C = \frac{u+v+1}{\pi(u^2+v^2+1)^2 \sqrt{3}} \Delta A_C \tag{13}$$

where u and v range from 1 to −2.

These delta form factors can be precalculated and accessed through a lookup table when receiver patches are projected onto the cubic tetrahedron faces during radiosity calculations.

Pseudodepth and Distance

An advantage of cubic tetrahedrons (and hemicubes) is that as each receiver patch R is projected onto a face cell, the distance from the center of the cubic tetrahedron to the portion of the patch visible through the face cell is calculated. This is useful in that the distance (or more properly the "pseudodepth" between the near and far clipping planes) is recorded in a depth buffer for the cubic tetrahedron face. As each patch is projected onto the face, only the nearest patch is recorded for each face cell. (See, for example, Ashdown 1994, Chapter 5 for details.) Both the acoustic power and pseudodepth are recorded in their respective buffers.

The face cell distance to the nearest patch is recorded as a nonlinear pseudodepth ndc within the range of 0.0 to 1.0, but this can be converted into physical distance d with:

$$d=(2*near*far)/(far+near-ndc*(far-near)) \tag{14}$$

where near is the near clipping plane distance and far is the far clipping plane distance.

While the distance from the sender patch to the receiver patch has no particular use in visual radiosity calculations, it is critical to acoustic radiosity. The velocity of sound in air is constant at v=340 m/sec, and so given an impulse that is emitted by as source or reflected from a patch at time t, the arrival of the acoustic power at the position on the receiver patch as determined by the face cell is t+d/340 seconds.

Once all of the receiver patches have been projected onto the cubic tetrahedron face, the acoustic power buffer is scanned to determine the total acoustic power received by each visible (or partially visible) receiver patch. The pseudodepth buffer can also be scanned to determine the earliest and latest arrival times of the impulse for each receiver patch. These arrivals times can be averaged to determine the time that the impulse will be reflected from the patch.

A received impulse is always reflected from the barycenter of a patch. A disadvantage of an overly large patch, especially for large angles of incidence, is that the range between the earliest and latest arrival times may be too broad, introducing inaccuracies in the timing of the reflected impulse. A solution to this problem is to adaptively subdivide the patch into a hierarchy of subpatches until the range of arrival times is less than a predetermined threshold.

The acoustic power of an impulse is also attenuated with distance from the source, due to energy dissipation by air molecules. This effect is generally insignificant when modeling room acoustics, being approximately 0.5 decibels per 100 meters at 1000 Hertz (but increasing to 10 decibels per 100 meters at 10 kilohertz). If necessary, however, it can be calculated using the distance between sender and receiver patches. It is an exponential decay function, but this can be quickly determined with a precalculated lookup table or a fast exponential approximation function.

Modeling Semi-Specular Reflections

Both visual and acoustic radiosity methods model surfaces as ideal diffuse (aka "Lambertian") reflectors. In acoustics, however, this assumption is only valid for frequencies with wavelengths less than approximately 1/10 of the scale of roughness for the surface material. The velocity of sound in air is approximately 0.34 m/msec, and so the scale of roughness for a one kilohertz signal will be on the order of 0.3 meters.

Figure 1:
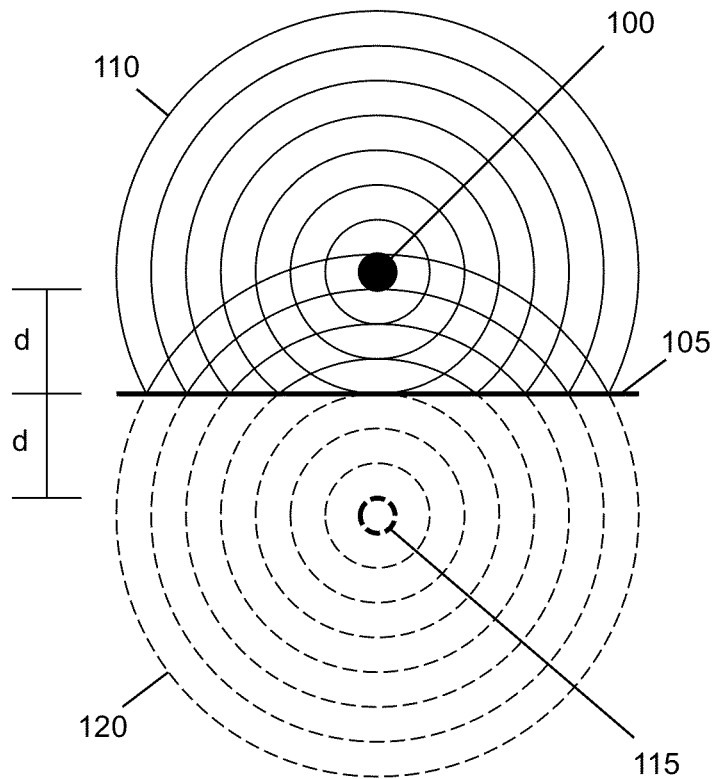
FIG. 1 shows an acoustic source and its image with a reflecting plane (prior art).
Figure 2:
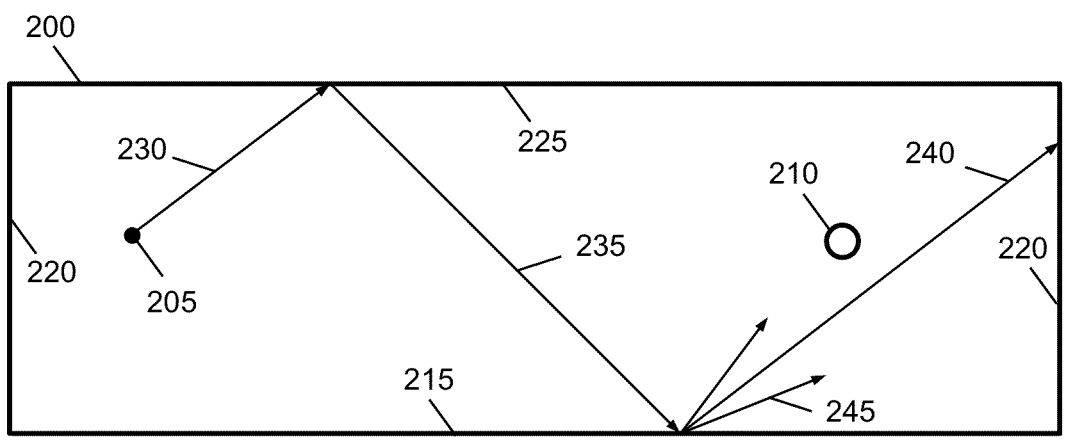
FIG. 2 shows an example of the ray tracing method (prior art).
Figure 3:
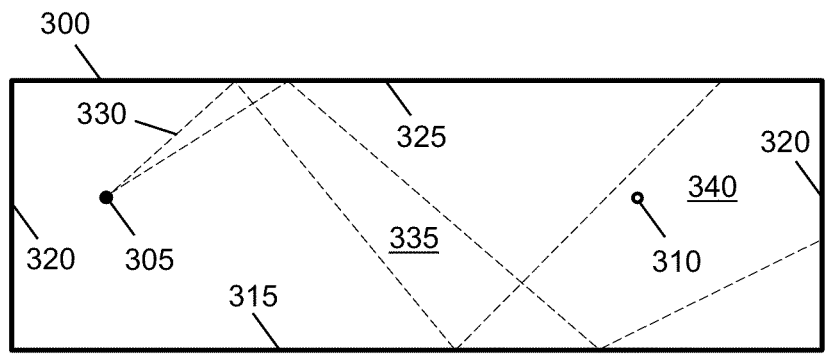
FIG. 3 shows an example of the beam tracing method (prior art).
Figure 4:
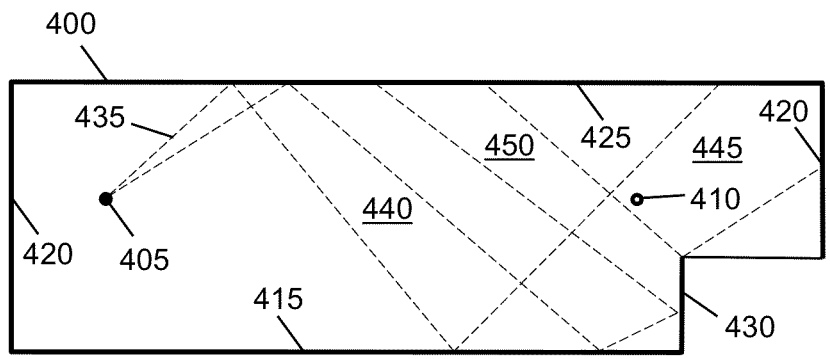
FIG. 4 shows an example of the beam tracing method with beam splitting (prior art).

On the other hand, a point source of sound will generate a spherical wavefront (e.g., FIG. 1), and so reflection from even an ideal specular reflector will be diffused due to its finite area. Consequently, it is only necessary to consider non-diffuse reflections for the first few reflections. Such semi-specular reflections are represented in computer graphics by bidirectional reflectance distribution function (BRDF) models, where their primary intent is to generate photorealistic reflections from glossy surfaces. For the purposes of acoustic radiosity, however, it is essential that the BRDF model is energy conservative.

A BRDF model is energy conservative if no more acoustic power can be reflected from a point on a surface than the amount of acoustic power incident on that point. Many models include in their formulation a normalization factor—different for each model—that is necessary to ensure energy conservation as the model parameters are changed.

Figure 14:
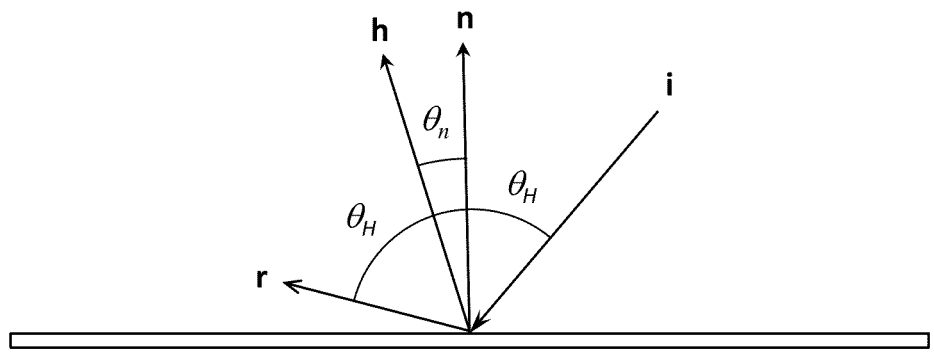
FIG. 14 illustrates the geometry of a glossy reflection.

A widely-used BRDF model for representing glossy reflections from semi-specularly reflective materials is the Blinn-Phong model, which is defined mathematically as:

$$B_r(i,r) = R(n \cdot h)^m \tag{15}$$

where in FIG. 14, i is the incident acoustic power vector, r is the reflected acoustic power vector, R is the diffuse reflectance of surface, m is the Blinn-Phong exponent, n is the surface normal, $$h = \frac{i+r}{|i+r|}$$

is the normalized half-vector between the incident and reflected acoustic power vectors, $\theta_H$ is the angle between h and either i or r, and $B_r(i, r)$ is the reflected acoustic power (assuming an incident ray with unit acoustic power). The reflection from the material surface is fully diffuse for m=0, but becomes increasingly specular with increasing m, and becomes fully specular for m=∞.

An equivalent formulation of the Blinn-Phong model is, again in reference to FIG. 14:

$$B_r(i,r) = R(\cos \theta_n)^m \tag{16}$$

where $\theta_n$ is the angle between the surface normal n and the normalized half-vector h.

Unfortunately, the Blinn-Phong BRDF model is not energy conservative. In order to ensure that the total amount of acoustic power remains constant as the Blinn-Phong exponent m is varied, it is necessary to add a multiplicative normalization term. A common formulation is:

$$B_r(i, r) = \frac{m+8}{8\pi} R(n \cdot h)^m \tag{17}$$

This is known, however, to be an approximation suitable for modeling light in computer graphics applications only. As such, it is not suitable for use with acoustic radiosity simulations.

To determine the exact normalization term, the total amount of acoustic power Φ reflected from the surface is determined by integrating the reflected acoustic power $B_r(i, r)$ over the hemisphere:

$$\Phi = \int_\omega B_r(\theta, \phi) \cos \theta d\omega \tag{18}$$

which, expressed in spherical coordinates, is:

$$\Phi = \int_0^{2\pi} \int_0^{\pi/2} B(\theta, \phi) \cos \theta \sin \theta d\theta d\phi \tag{19}$$

If the incident acoustic power is perpendicular to the surface, the reflected acoustic power B is independent of φ and we have θ being the angle between the reflectance vector r and the surface normal n, which means that $\theta_n = \theta/2$. Thus:

$$\Phi = 2\pi R \int_0^{\pi/2} \left(\cos\left(\frac{\theta}{2}\right)\right)^m \cos\theta \sin\theta d\theta \tag{20}$$

Using the half-angle formula $$\cos\left(\frac{\theta}{2}\right) = \sqrt{(1+\cos\theta)/2}$$

and the substitution t=cos θ (which gives dt=−sin θdθ), we have:

$$\Phi = 2\pi R \left(-\int_1^0 \left(\sqrt{\frac{1+t}{2}}\right)^m\right) t dt = 2\pi R \int_0^1 \left(\frac{1+t}{2}\right)^{m/2} t dt \tag{21}$$

which can be evaluated using integration by parts (that is, ∫udv=uv−∫vdu) using $$u = \left(\frac{1+t}{2}\right)^{m/2}$$

and v=t, and by removing the constant reflectance R, we have:

$$2\pi \left(\left[\frac{4}{m+2} t \left(\frac{1+t}{2}\right)^{(m+2)/2}\right]_{t=0}^1 - \frac{4}{m+2} \int_0^1 \left(\frac{1+t}{2}\right)^{(m+2)/2} dt\right) = \tag{22}$$

$$\frac{8\pi}{m+2} \left(\left[t\left(\frac{1+t}{2}\right)^{(m+2)/2}\right]_{t=0}^1 - \frac{4}{m+4}\left[\left(\frac{1+t}{2}\right)^{(m+4)/2}\right]_{t=0}^1\right) =$$

$$\frac{8\pi}{m+2}\left[\cos\theta \cos\left(\frac{\theta}{2}\right)^{m+2} - \frac{4}{m+4}\cos\left(\frac{\theta}{2}\right)^{m+4}\right]_{\theta=\pi/2}^0 =$$

$$\frac{8\pi\left[\cos\left(\frac{\theta}{2}\right)^{m+2}\left(4\left(\cos\left(\frac{\theta}{2}\right)\right)^2 - (m+4)\cos\theta\right)\right]_{\theta=0}^{\pi/2}}{(m+2)(m+4)} =$$

$$\frac{8\pi\left[\cos\left(\frac{\theta}{2}\right)^{m+2}(2(1+\cos\theta) - (m+4)\cos\theta)\right]_{\theta=0}^{\pi/2}}{(m+2)(m+4)} =$$

$$\frac{8\pi\left[\cos\left(\frac{\theta}{2}\right)^{m+2}(2-(m+2)\cos\theta)\right]_{\theta=0}^{\pi/2}}{(m+2)(m+4)} =$$

$$\frac{8\pi\left[2^{1-((m+2)/2)} - (2-(m+2))\right]}{(m+2)(m+4)} = \frac{8\pi(2^{-m/2}+m)}{(m+2)(m+4)}$$

Figure 15:
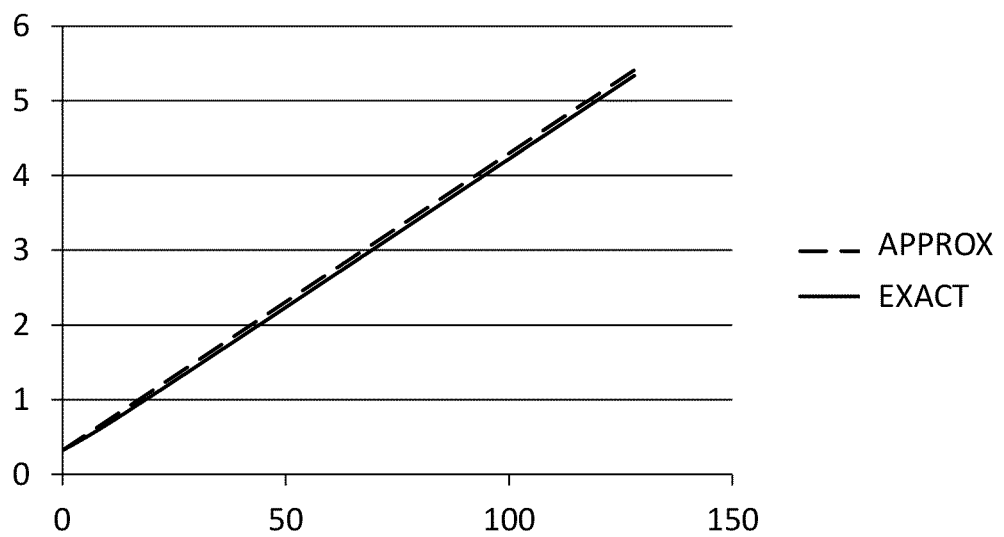
FIG. 15 plots approximate and exact Blinn-Phong normalization terms versus the Blinn-Phong exponent.

The exact energy-conserving normalization term is therefore $$\frac{(m+2)(m+4)}{8\pi(2^{-m/2}+m)}$$

and so the exact energy-conserving Blinn-Phong BRDF model for acoustic radiosity is:

$$B_r(i, r) = \frac{(m+2)(m+4)}{8\pi(2^{-m/2}+m)} R(n \cdot h)^m \quad (23)$$

where both normalization terms are shown in FIG. 15.

Figure 16:
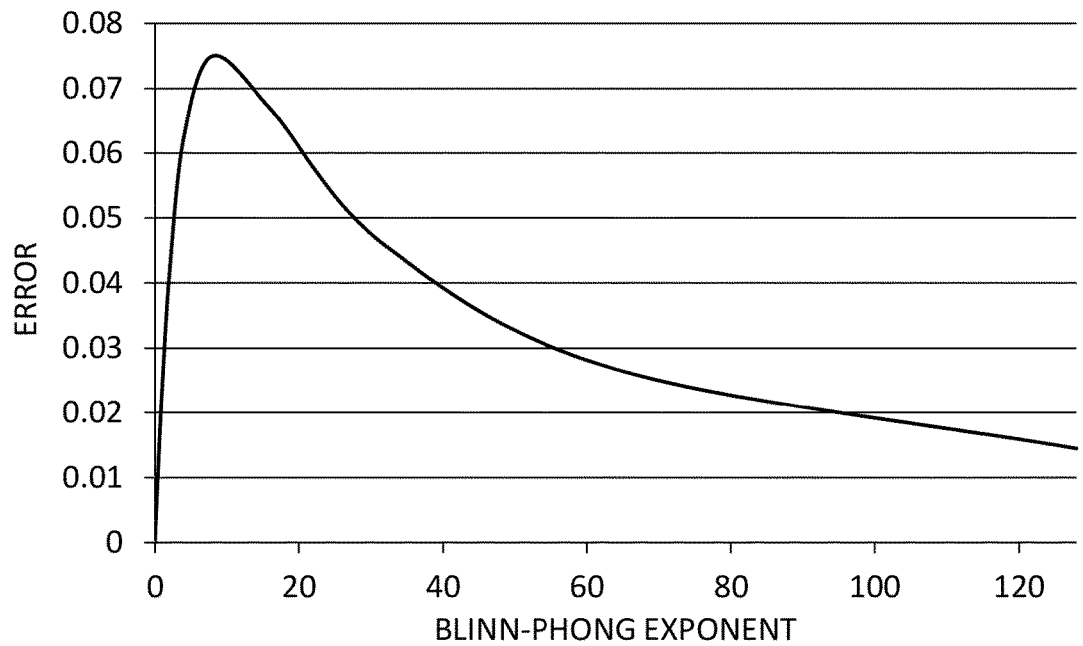
FIG. 16 plots the approximate Blinn-Phong normalization term error.
Figure 17:
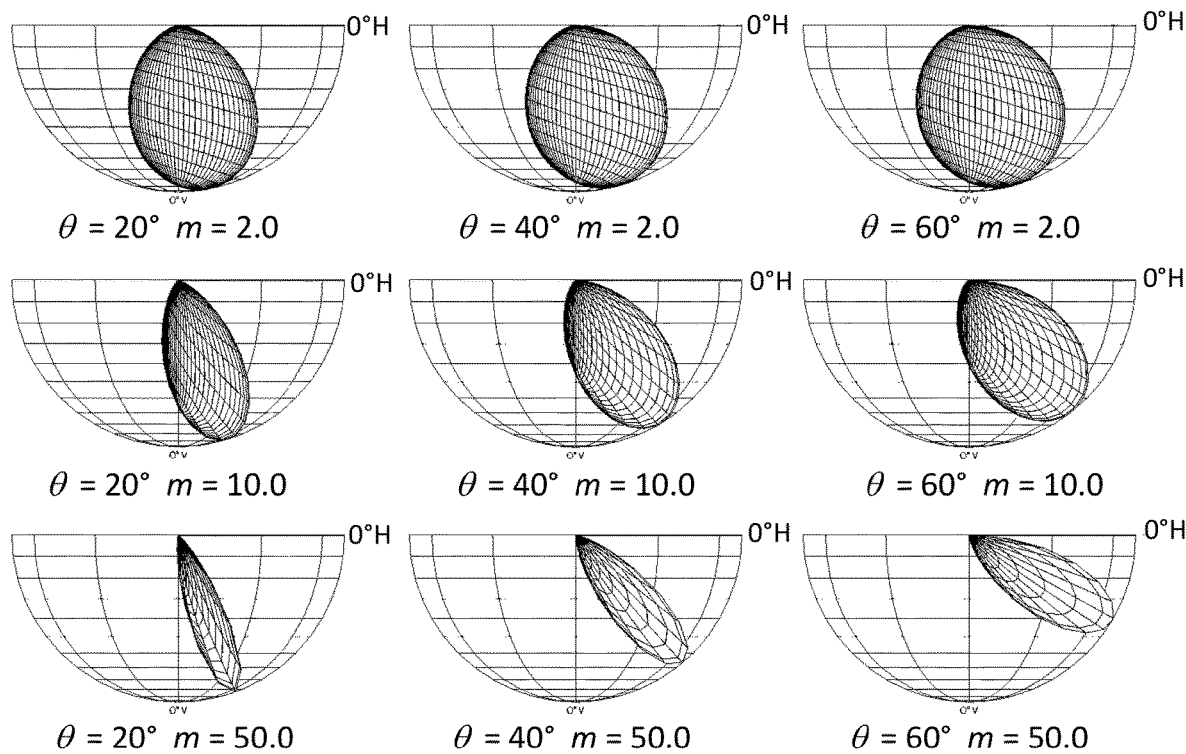
FIG. 17 shows example analytic bidirectional transmittance distribution functions.

Plotted against the approximate normalization term $$\frac{m+8}{8\pi},$$

the error is shown in FIG. 16. The maximum error for m=10 is 7.5 percent, which justifies the use of the exact normalization term in physically correct acoustic radiosity calculations.

It is possible to consider Equation 23 as representing the intensity distribution of a point acoustic source. This distribution will be dependent on the incidence angle of the incident ray, but the analogy still holds. Acoustic intensity in a given direction may be defined as:

$$I = d\Phi/d\omega \quad (24)$$

where $d\Phi$ is the differential radiant flux contained in an elemental cone with differential solid angle $d\omega$ that is oriented in the given direction.

Figure 13:
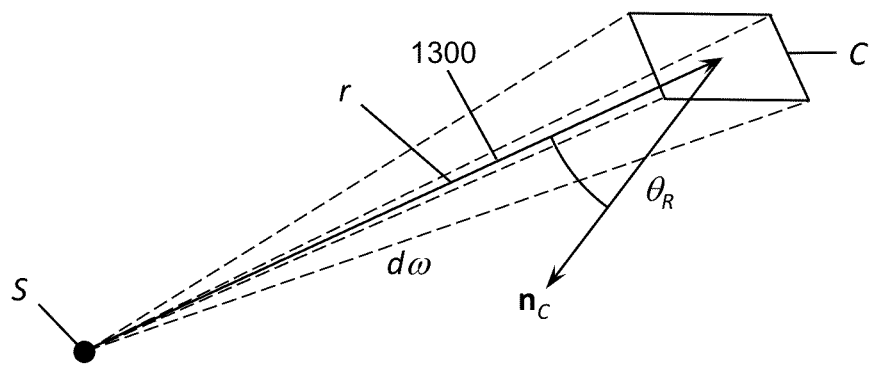
FIG. 13 shows the cubic tetrahedron face cell geometry.

Referring to FIG. 13 then, the acoustic power from a point source S with an intensity distribution $I(\theta, \phi)$ that is received by a cubic tetrahedron face cell C with surface area $\Delta A_C$ and is at a distance r and at an angle $\theta_C$ to the face cell normal $n_C$ is:

$$\Phi_C = \int_\omega I(\theta, \phi) \cos \theta_C d\omega \quad (25)$$

where the differential solid angle $d\omega$ is approximately:

$$d\omega \approx \cos \theta_C \Delta A_C / r^2 \quad (26)$$

For each cell with variable coordinates u and v, and n=1, we have from Equation 12:

$$r = \sqrt{u^2 + v^2 + 1} \quad (27)$$

and from Equation 10:

$$\cos \theta_C = 1/r \quad (28)$$

Thus, the acoustic power received by each cubic tetrahedron cell is:

$$\Delta \Phi_C \approx I(\theta, \phi) \Delta A_C / (u^2 + v^2 + 1)^{3/2} \quad (29)$$

and similarly, for coordinates pairs u, n and v, n. (A similar derivation is possible for hemicube face cells.) The term $\Delta A_C/(u^2+v^2+1)^{3/2}$ is referred as the "diffusion parameter" of the cubic tetrahedron cell, or more generally of a ray 1300 originating from the cubic tetrahedron center (point S) in the direction of the center of the cell C. This ray is equivalent to ray E in FIG. 9. Further, as previously noted, the term $I(\theta, \phi)$ may be an analytic calculation of the BRDF function such as the Blinn-Phong model.

Thus, if the receiver patch R is projected on n cells of a cubic tetrahedron, the acoustic power $\Phi_R$ received by the patch from the point source is approximately:

$$\Phi_R \approx \Sigma_n I(\theta, \phi) \Delta A_C / (u^2 + v^2 + 1)^{3/2} \quad (30)$$

which again converges to $\Phi_R$ as the cubic tetrahedron cell size decreases.

Modeling Non-Isotropic Sources

Figure 5:
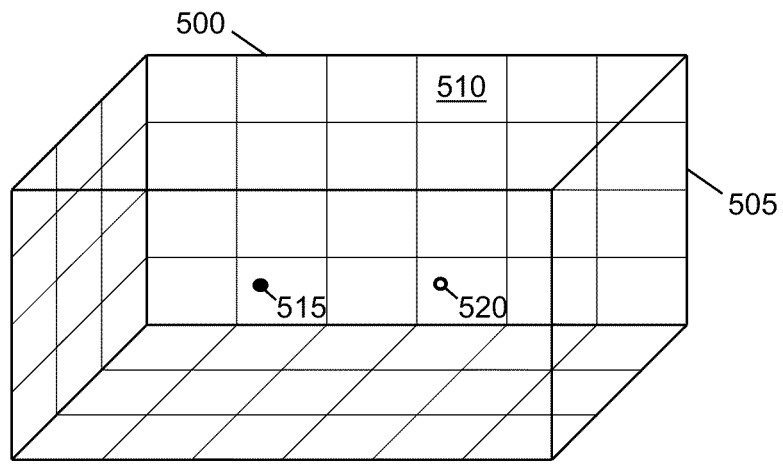
FIG. 5 shows an empty rectangular room with its surfaces subdivided into arrays of patches (prior art).
Figure 5A:
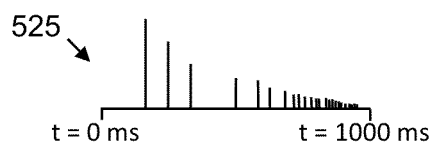
FIG. 5A shows a patch echogram for the room of FIG. 5 (prior art).
Figure 6:
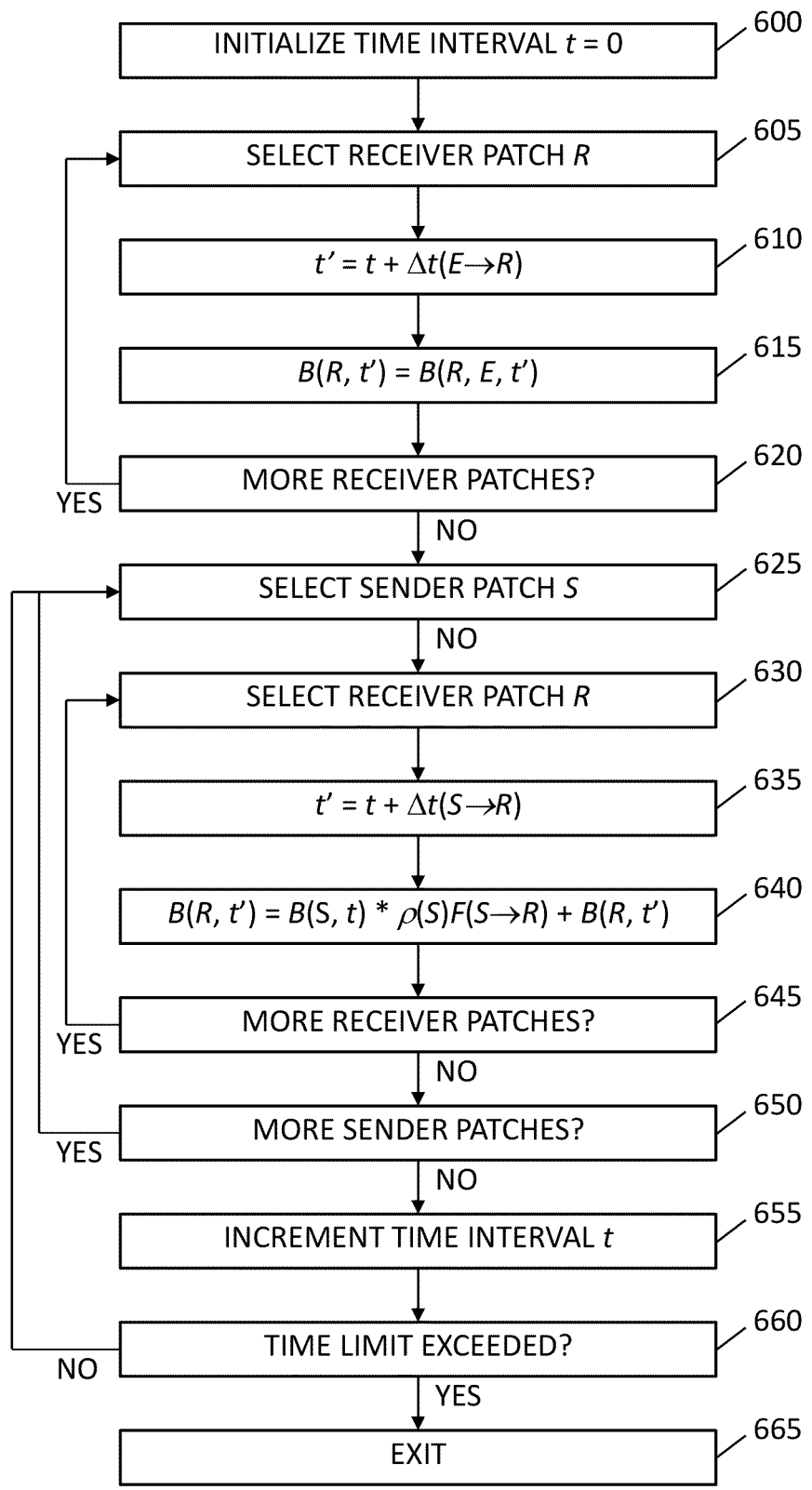
FIG. 6 shows a flowchart implementing a prior art acoustic radiosity algorithm.

The prior art for acoustic radiosity (e.g., Nosal et al. 2002) does not consider how to determine the distribution of direct acoustic power from the source to the receiver patches. For "toy" environments such as that shown in FIG. 5, the acoustic power received by a patch R from an isotropic source E can be determined by calculating the form factor $F(E \rightarrow R)$ analytically using form factor algebra (as developed for radiative transfer in thermal engineering). However, this approach is computationally impractical for complex room environments with many occlusions (such as seats in a concert hall). Further, most sound sources, such as loudspeakers and human speakers, have non-isotropic intensity distributions.

Figure 18:
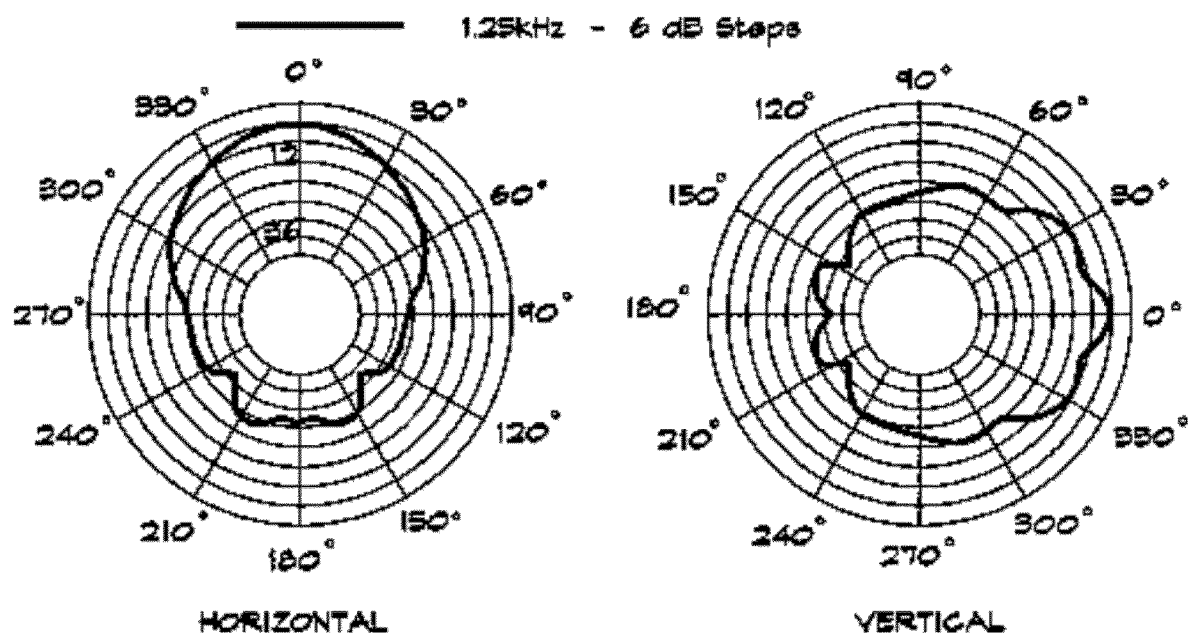
FIG. 18 shows the horizontal and vertical acoustic intensity distributions of a commercial loudspeaker (prior art).

It is however possible to measure or simulate the acoustic intensity distribution of a sound source. FIG. 18, for example, shows the frequency-dependent intensity distribution (expressed in decibels) in the horizontal and vertical planes of a commercial loudspeaker. If this distribution is interpolated as a three-dimensional function $I(\theta, \phi)$, it can be substituted into Equation 29 to distribute acoustic power from the source to all visible receiver patches using a cubic tetrahedron. If the intensity distribution function $I(\theta, \phi)$ is omnidirectional, the acoustic power can be distributed using two back-to-back cubic tetrahedrons.

Time Buffers

The prior art approach to representing receiving patch time buffers is to assign a memory array with a length of several seconds and a time resolution of several milliseconds. A disadvantage of this approach is that most of the beginning of the buffer will remain empty. The present invention therefore represents a time buffer as a linked list of events, with each event record including:

Impulse arrival time
Impulse power
Incidence direction (optional)
Secondary source flag (optional)

The impulse arrival time is represented as a floating point number, and so is independent of the time resolution of a prior art time buffer. The impulse power may be optionally represented by two or more frequency bands to model sources and material with frequency-dependent emission and reflectance properties respectively. The optional incidence director is a vector representing the direction of the incident impulse. It can be used to calculate the non-diffuse reflection from semi-specular materials. The optional secondary source flag indicates whether the incident impulse was received from a source or another patch. If the impulse was received directly from a source, then using the modified Blinn-Phong model for non-diffuse reflection effectively models the patch as a secondary source; otherwise, a diffuse reflection (which is much faster to calculate) can be used.

Multiple events with the same arrival time can be either be combined if the secondary source flag is false, or stored and later processed separately.

Acoustic Radiosity Algorithm

Figure 19:
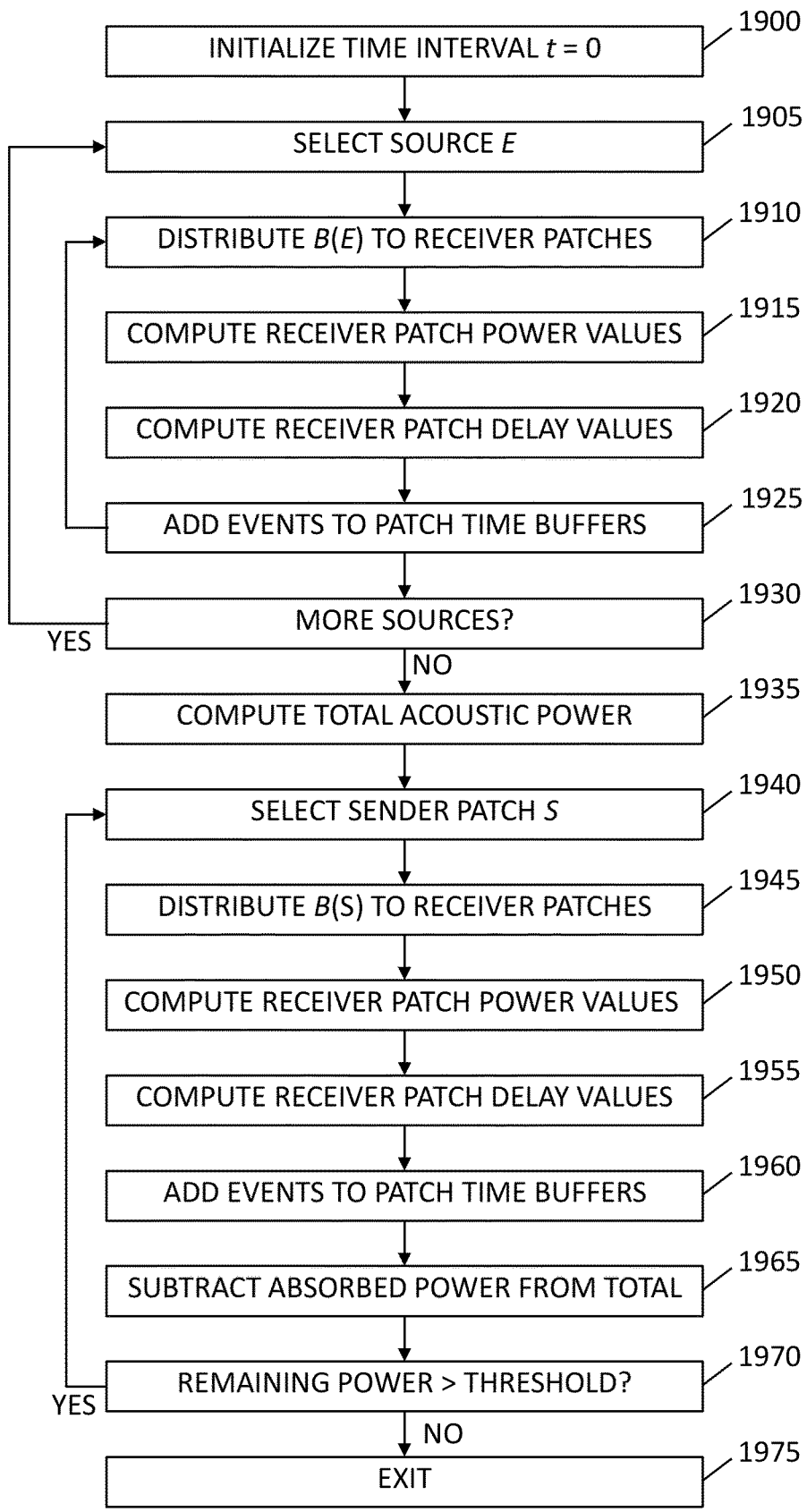
FIG. 19 shows a flowchart implementing the present acoustic radiosity algorithm, according to an embodiment of the present invention.

FIG. 19 shows a flowchart of an exemplary acoustic radiosity algorithm with $O(n^2)$ time complexity, where n is the number of receiver patches, where form factors are lazily computed (i.e. as and when needed) for each reflection, and where reflections may be diffuse or semi-specular, and which supports multiple non-isotropic sound sources and surface materials with frequency-dependent reflection characteristics.

In Step 1900, the time interval t is set to zero, representing the time that one or more sources, labelled E, simultaneously emit impulses. Time zero may represent the time at which a short but finite impulse starts.

In Step 1905, the first of m sources E(i) is selected.

In Step 1910, the acoustic power of source E(i) is distributed according to its acoustic intensity distribution to all visible receiver patches using one or two cubic tetrahedrons.

In Step 1915, the cubic tetrahedron acoustic power buffers are scanned to accumulate the acoustic power received by each patch visible to the source.

In Step 1920, the cubic tetrahedron depth buffers are scanned to determine the shortest and longest delay times of the source E(i) impulse. If the difference in delay time exceeds a predetermined value, the receiver patch is recursively subdivided until the delay time difference for each subpatch does not exceed the predetermined value. The acoustic power buffer is then rescanned for the subdivided patches and the acoustic power accumulated accordingly.

In Step 1925, the received impulse events are added to the receiver patch time buffers. The buffers correspond to the echograms that correspond to the patches.

In Step 1930, control is returned to Step 1905 if more sources are to be processed. Otherwise, all direct acoustic power has been distributed to the receiver patches, and control proceeds to Step 1935.

In Step 1935, the total acoustic power emitted by the sources is calculated and saved.

In Step 1940, the list of all receiver patch events is searched for the event with the greatest amount of acoustic power to reflect. This patch is designated as the sender patch S.

In Step 1945, the reflected acoustic power B(S(i)) is distributed from the sender patch S to all visible receiver patches using a cubic tetrahedron. If the surface material is semi-specular and it is the first reflection, the modified Blinn-Phong model is used with the incident direction of the source and the assigned model exponent m to distribute the acoustic power non-diffusely. Otherwise, the acoustic power is reflected diffusely.

In Step 1950, the cubic tetrahedron acoustic power buffers are scanned to accumulate the acoustic power received by each patch visible to the sender patch.

In Step 1955, the cubic tetrahedron depth buffers are scanned to determine the shortest and longest delay times of the sender S(i) impulse. If the difference in delay time exceeds a predetermined value, the receiver patch is recursively subdivided until the delay time difference for each subpatch does not exceed the predetermined value. The acoustic power buffer is then rescanned for the subdivided patches and the acoustic power accumulated accordingly.

In Step 1960, the received impulse events are added to the receiver patch time buffers.

In Step 1965, the acoustic power absorbed by the sender patch is subtracted from the total acoustic power emitted by the sources, to result in the remaining acoustic power. The remaining acoustic power is that which still possibly needs to be distributed within the environment. Other ways of tracking this remaining power are possible, for example, the running total of the amount of acoustic power absorbed may be counted.

In Step 1970, the remaining acoustic power is divided by the total acoustic power. If the result is greater than a predetermined threshold, control is returned to Step 1940. Other mathematical methods may be used to determine whether the threshold has been met. Otherwise, control proceeds to Step 1975.

In Step 1975, the calculation of the echogram for each of the n patches terminates.

Expressed in pseudocode, the present acoustic radiosity algorithm is:

```
t = 0
FOR each source E
    Distribute B(E) to receiver patches
    Compute receiver patch power values
    Compute receiver patch delay values
    Add events to patch time buffers
ENDFOR
Compute total power
DO
    Select sender patch S with maximum reflected power
    Distribute B(S) to receiver patches
    Compute receiver patch power values
    Compute receiver patch delay values
    Add events to patch time buffers
    Subtract absorbed power from total power
WHILE remaining power / total power > threshold
```

Two key aspects of the present algorithm are: 1) it terminates when the remaining acoustic power being reflected in the environment is less than a predetermined limit; 2) it always selects the sender patch with the maximum amount of acoustic power to reflect, thereby ensuring that the most significant reflections are prioritized. As such, some patches may be subject to two or more reflections while other patches may not be subject to any reflections. In addition, all compute-intensive steps of the algorithm can be parallelized, thereby minimizing computation time.

Once the echograms have been calculated for each of the patches in the environment, they can be used to determine the reverberation at the location of each patch. Locations close to a patch can be approximated to have the same echogram as the patch. For example, locations within 2 m of a patch may be sufficiently approximated by the patch. Locations within the volume of the room more than about 2 m away from a wall or a floor do not need to have an echogram determined as it would be expected that nobody would occupy this space. The echogram at a patch is then convolved with an audio signal to approximate the reverberation heard in the environment at the location of the patch or near the patch.

Figure 20:
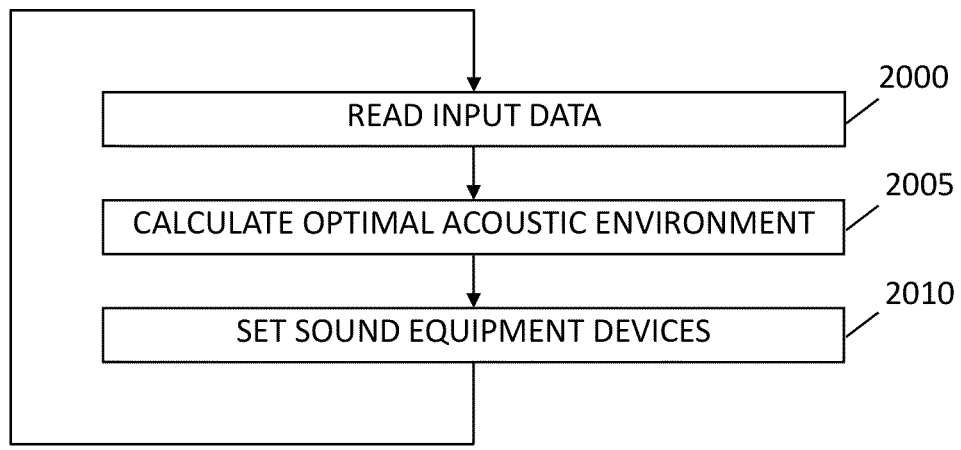
FIG. 20 shows a flowchart for operation of the acoustic modelling system, according to an embodiment of the present invention.

FIG. 20 shows one embodiment wherein acoustic sensors in step 2000 may be used to determine actual or real world receiver patch values. The acoustic sensors are placed in one or more locations in the physical environment that correspond to different patches in the model. In step 2005 the optimal acoustic environment may be calculated or otherwise determined based on the detected sounds. The optimal acoustic environment may be different for different activities, occupancies or occasions in the physical environment. This will allow a user in step 2010 to adjust and control amplifiers, speakers, monitors or other sound equipment in the physical environment based on the generated acoustics for the corresponding virtual environment. For example, the RIR at each location where there is a sound sensor may be compared to the optimum RIR for the location. The positions, directions and power of the audio equipment in the model of the virtual environment may be changed to generate a new set of RIRs for the virtual environment. Alternately, there may be a catalogue of RIRs for different audio equipment set-ups. By comparison between the optimal acoustic environment and the generated acoustic environment, the differences can be minimized by changing the model of the virtual environment. With this knowledge in hand, the user may alter the audio equipment to optimize the acoustics of the physical environment. This may include adjusting the power of the amplifiers, the direction or position of the speakers, the direction or position of the monitors or adjusting other sound equipment.

In a further embodiment an acoustic feedback system may be employed, such that generated acoustics, through amplifiers, speakers, monitors or other sound equipment, in step 2010 may be adjusted and controlled automatically by a computer. This may include, through a set of servos or other means of automated movement, adjusting the power of the amplifiers, the direction or position of the speakers, the direction or position of the monitors or adjusting other sound equipment.

Figure 21:
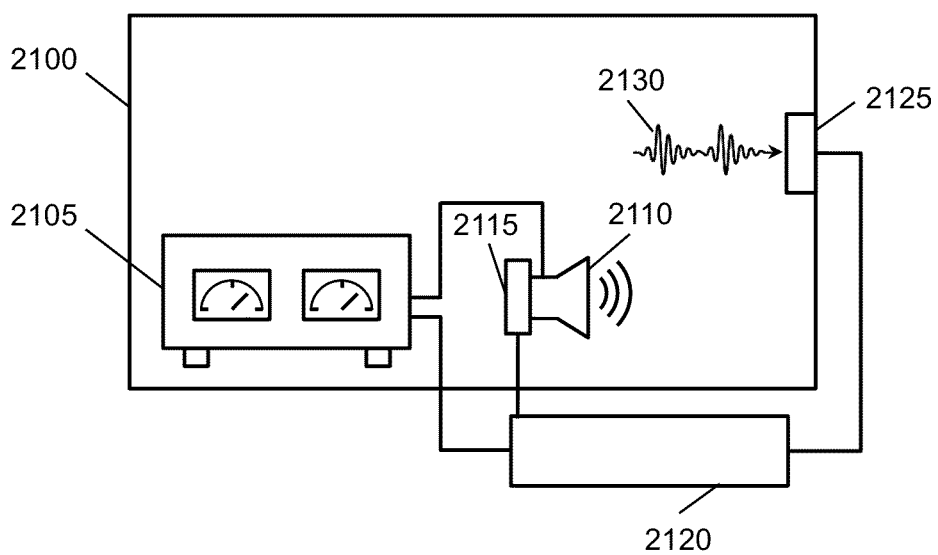
FIG. 21 is a schematic diagram of a system for calculating room impulse responses and reverberations, and controlling audio equipment in the room, according to an embodiment of the present invention.

Referring to FIG. 21, an exemplary room 2100 is shown with an amplifier 2105 connected to a speaker 2110 that is mounted on a translation and rotation stage 2115, which is operated by servos controlled by the system 2120. Also connected to the system is a sound sensor 2125, which is positioned on a wall of the room and detects audio signal 2130. The system includes a computer that calculates and/or stores the RIR for each location in the room and convolves an audio signal with one or more of the RIRs. The computer also controls the amplifier and the translation and rotation stage on which the speaker is mounted. Different RIRs may be stored in the computer for different speaker positions and amplifier levels, and there may also be stored a lookup table of the RIRs at a given position for the different speaker positions and amplifier settings. As such, by monitoring the sound via the acoustic sensor and comparing it to an optimal value for that location in the room, the position of the speaker, direction of the speaker and level of the amplifier may be altered automatically in order to adjust the acoustics of the audio equipment set-up in the room closer towards the optimum value.

Figure 22:
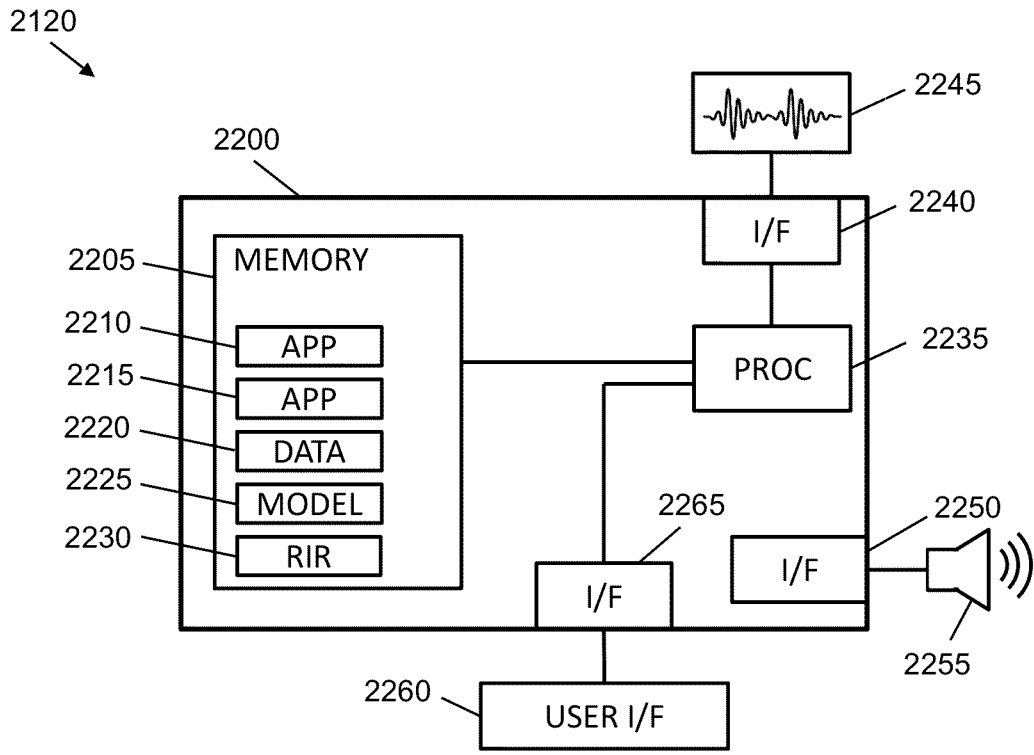
FIG. 22 is a schematic block diagram of a system for calculating room impulse responses and reverberations, according to an embodiment of the present invention.

Referring to FIG. 22, an exemplary system 2120 is shown. The system includes a computer 2200, which includes computer readable memory 2205 storing computer readable instructions in the form of applications 2210, 2215. One application 2210 calculates the RIRs for a virtual environment using data 2220, for example, that describes the acoustic properties of different kinds of surfaces. The other application 2215 convolves the RIR at a given location with an audio stream or signal. Also stored in the memory is a model 2225 of the environment for which the RIRs 2230 are calculated, which are also stored in the memory. The memory is connected to a processor 2235, which is connected by an interface 2240 to a source 2245 of an audio signal or audio stream. The processor is also connected via another interface 2250 to a speaker 2255, through which the audio signal convolved with the RIR at a given location is output.

Figure 23:
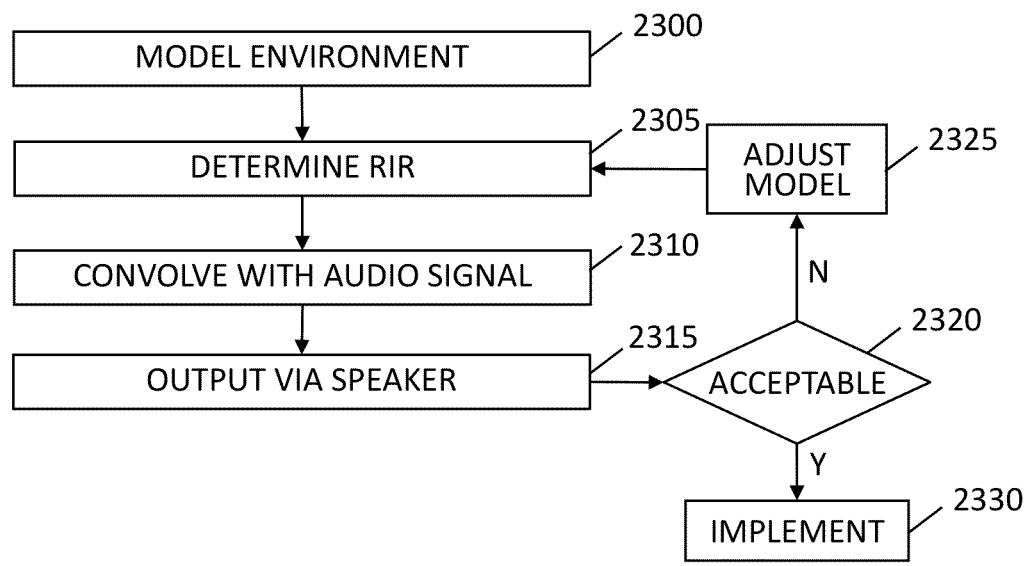
FIG. 23 is a flowchart for calculating room impulse responses, generating reverberations and making adjustments, according to an embodiment of the present invention.

A user interface 2260, which may be another computer, or a monitor and keyboard, for example, is also connected to the processor via another interface 2265. The system may be controlled via the user interface, e.g. to create 2300 (FIG. 23), load or modify 2325 the model of the virtual environment, to control the calculation 2305 of the RIRs, to convolve 2310 an RIR with an audio signal, and to output 2315 the convolved audio signal. If the convolved audio signal is unacceptable, in step 2320, the model is adjusted. Physical elements of a physical environment that may be modified (pre-build or as an upgrade) to optimize reverberation include, e.g. adding/removing/altering corners and/or flat surfaces; adding texture to surfaces; and optimum positioning of traditional acoustic-dampening foam. If the convolved audio signal is acceptable, in step 2320, the modifications are implemented in the physical environment or the physical environment is built. The user interface may display a virtual mixing board. This virtual mixing board may interface with the actual sound system to act as the actual mixing board. Thus the sound can be modeled, mixed for the model, controlled and modified on the fly all using the same system and same user interface. Signals may be added to the microphone input for output on existing loudspeakers that cancel and/or reduce the reverberation.

In general, the RIR for a virtual environment is convolved in real-time with a real audio signal or stream, to generate a resulting audio signal or stream that represents the reverberation of the original audio signal or stream within the virtual environment. The resulting audio signal or stream is fed to a loudspeaker, headphones, earphones or multiple loudspeakers so that the reverberation can be heard. The virtual environment may be a model of the interior of an existing real-world building or room, or it may be a model of the interior of a room or building that is to be built.

The impulse responses are in general dependent on the occupancy of the building. In a concert hall, for example, empty seats may present more reflective surfaces than occupied seats. Different impulse responses may be calculated for different levels of occupancy, or different locations of people within the hall or other building. Depending on the occupancy (number and distribution), this may lead to different settings and/or positioning of the audio equipment. In some embodiments, it may be sufficient to use an average impulse response based on an average occupancy level, irrespective of the actual occupancy level of the building.

In a further embodiment an AI (artificial intelligence) system may be employed with respect to determining optimal acoustic environments.

In a further embodiment one or more GPUs (graphics processing units) are configured to generate aspects of the optimal acoustic environment.

The generated acoustics for a virtual environment may be compared to signals from acoustic sensors in the physical environment to which the virtual environment corresponds. This may be to verify the accuracy of the generated acoustics and/or the model of the environment. The generated acoustics may be scaled or otherwise adjusted so that they match the real-world measured sound levels more accurately. Different parts of the model or different parts of the calculated acoustic environment may be adjusted differently from other parts. Adjustments may be made in the decibel level and/or the decay time of the reverberation.

The system may be used for lecture halls, conference rooms, theatres, shopping malls, lobbies, restaurants, airports, train stations, places of worship, indoor public swimming pools, residential rooms and any other indoor space. The system may be used before the building is built, and the model of the building adjusted to optimize acoustics before the building is actually built. The system may be used before renovating the building, or before adding acoustic upgrades.

Sound refraction may be neglected in this system and method. In practice, it would be highly unusual to have an obstruction with nothing else around it. A pillar in a concert hall, for example, would be surrounded by a floor, ceiling, and walls, all of which reflect sound to the listener. These reflections will in almost every conceivable situation mask any refracted sound.

The present invention is herein described more fully with reference to the accompanying drawings, in which embodiments of the invention are shown. This invention may, however, be embodied in many different forms, and should not be construed as being limited to the embodiments described herein. Rather, these embodiments are provided so that this disclosure will be thorough and complete, and will fully convey the scope of the invention to those skilled in the art.

Individual parts of the system may be referred to as modules. The term "module" can refer to any component in this invention and to any or all of the features of the invention without limitation. A module may be a software, firmware or hardware module, and may be located in a user device or a server or other computing device. Modules may be divided into constituent modules or combined into larger modules.

Mathematically equivalent calculation may be substituted for those described herein.

Throughout the description, specific details have been set forth in order to provide a more thorough understanding of embodiments of the invention. However, the invention may be practised without these specific details. In other instances, well known elements have not been shown or described in detail and repetitions of steps and features have been omitted to avoid unnecessarily obscuring the invention. Embodiments, depending on their configuration, may exhibit all or fewer than all of the advantages described herein. Other advantages not mentioned may be present in one or more of the embodiments. Features from any of the embodiments may be combined with features from any of the other embodiments to form another embodiment within the scope of the invention. In general, unless otherwise indicated, singular elements may be in the plural and vice versa with no loss of generality. Accordingly, the scope of the invention is to be construed in accordance with the substance defined by the claims.

I claim:

1. A method for simulating acoustics of a physical environment within a building comprising the steps of:
   (a) dividing surfaces of a virtual environment that corresponds to the physical environment into patches, each patch having an echogram;
   (b) distributing total acoustic power of an audio impulse generated by an acoustic source directly to those of the patches that are visible to the acoustic source;
   (c) storing, in the echogram for each patch that receives a portion of the total acoustic power, a value and a time corresponding to said portion of the total acoustic power;
   (d) selecting the patch that has the most acoustic power to reflect;
   (e) determining acoustic power that is absorbed by the selected patch;
   (f) distributing reflected acoustic power from the selected patch to those of the patches that are visible to the selected patch;
   (g) storing, in the echogram for each patch that receives a portion of the reflected acoustic power, a value and a time corresponding to said portion of the reflected acoustic power;
   (h) repeating steps (d) to (g) until a difference between the total acoustic power and a total of the acoustic power absorbed by all selected patches has reached a threshold; and
   (i) playing, via an audio output device, an audio signal that has been convolved with one of the echograms.

2. The method of claim 1, comprising repeating steps (b) and (c) for another audio impulse generated by another acoustic source simultaneously with the audio impulse.

3. The method of claim 1, wherein said times are stored as floating point values.

4. The method of claim 1, comprising:
   for each patch that receives one of said portions of the total acoustic power, storing in the corresponding echogram an angle of incidence of the received portion of the total acoustic power; and
   for each patch that receives one of said portions of the reflected acoustic power, storing in the corresponding echogram an angle of incidence of the received portion of the reflected acoustic power.

5. The method of claim 4, comprising:
   setting, in each of said corresponding echograms, a flag that differentiates between receipt of said one portion of the total acoustic power and receipt of said one portion of the reflected acoustic power;
   wherein step (f) comprises:
   using an energy-conserving Blinn-Phong bidirectional reflectance distribution function for acoustic radiosity for a first reflection from the selected patch when the selected patch has a semi-specular texture, to distribute the reflected acoustic power non-diffusely; or
   distributing the reflected acoustic power diffusely for a second and later reflection or when the selected patch has a diffuse texture.

6. The method of claim 1, wherein:
   steps (d)-(h) are performed for one audible frequency band;
   steps (d)-(h) are repeated for another audible frequency band; and
   the echogram comprises said values and said times for both of said audible frequency bands.

7. The method of claim 1 comprising for one of said patches:
   calculating a time difference between arrival of the corresponding portion of the total acoustic power or the corresponding portion of the reflected acoustic power at different locations on said one patch;
   determining that the time difference is greater than a threshold time;
   subdividing said one patch into smaller patches until each smaller patch has a respective time difference below the threshold time; and
   continuing the method by treating the smaller patches as patches.

8. The method of claim 1, wherein the virtual environment comprises data values representing acoustic properties of the surfaces, said data values representing one or more of:
   acoustic reflectivity;
   acoustic absorption;
   texture.

9. The method of claim 1, further comprising:
   determining optimal acoustics for the physical environment;
   adjusting a location, direction or power of the acoustic source in the virtual environment so that the simulated acoustics become closer to the optimal acoustics; and setting sound equipment in the physical environment to correspond to the adjusted location, direction or power of the acoustic source.

10. The method of claim 1, further comprising:
modifying an element of the virtual environment to adjust the simulated acoustics; and
adjusting a physical element in the physical environment corresponding to the modification of the element in the virtual environment.

11. A system for simulating acoustics of a physical environment within a building comprising:
an audio output device;
a processor; and
computer readable memory storing computer-readable instructions, which, when executed by the processor cause the system to:
(a) divide surfaces of a virtual environment that corresponds to the physical environment into patches, each patch having an echogram;
(b) distribute total acoustic power of an audio impulse generated by an acoustic source directly to those of the patches that are visible to the acoustic source;
(c) store, in the echogram for each patch that receives a portion of the total acoustic power, a value and a time corresponding to said portion of the total acoustic power;
(d) select the patch that has the most acoustic power to reflect;
(e) determine acoustic power that is absorbed by the selected patch;
(f) distribute reflected acoustic power from the selected patch to those of the patches that are visible to the selected patch;
(g) store, in the echogram for each patch that receives a portion of the reflected acoustic power, a value and a time corresponding to said portion of the reflected acoustic power;
(h) repeat steps (d) to (g) until a difference between the total acoustic power and a total of the acoustic power absorbed by all selected patches has reached a threshold; and
(i) play, via the audio output device, an audio signal that has been convolved with one of the echograms.

12. The system of claim 11 comprising one or more acoustic sensors in the physical environment that provide feedback to the processor.

13. The system of claim 11 comprising at least one speaker in the physical environment that has a location, a direction or both a location and direction controlled by the processor.

14. The system of claim 13 comprising a user interface connected to the processor that accepts inputs to:
modify the virtual environment; and
control the location, direction or both the location and direction of said at least one speaker.

15. Non-transitory computer readable memory storing computer-readable instructions, which, when executed by a processor cause the processor to:
(a) divide surfaces of a virtual environment that corresponds to a physical environment into patches, each patch having an echogram;
(b) distribute total acoustic power of an audio impulse generated by an acoustic source directly to those of the patches that are visible to the acoustic source;
(c) store, in the echogram for each patch that receives a portion of the total acoustic power, a value and a time corresponding to said portion of the total acoustic power;
(d) select the patch that has the most acoustic power to reflect;
(e) determine acoustic power that is absorbed by the selected patch;
(f) distribute reflected acoustic power from the selected patch to those of the patches that are visible to the selected patch;
(g) store, in the echogram for each patch that receives a portion of the reflected acoustic power, a value and a time corresponding to said portion of the reflected acoustic power;
(h) repeat steps (d) to (g) until a difference between the total acoustic power and a total of the acoustic power absorbed by all selected patches has reached a threshold; and
(i) play, via an audio output device, an audio signal that has been convolved with one of the echograms.

* * * * *